United States Patent [19]
Brown

[11] Patent Number: 5,710,701
[45] Date of Patent: Jan. 20, 1998

[54] METHOD AND APPARATUS FOR POWER SUPPLY TESTING

[75] Inventor: Alan E. Brown, Georgetown, Tex.

[73] Assignee: Dell USA, L.P., Austin, Tex.

[21] Appl. No.: 509,264

[22] Filed: Jul. 31, 1995

[51] Int. Cl.$^6$ ............................ G05B 9/02; G01R 31/36
[52] U.S. Cl. ................................ 364/185; 324/771
[58] Field of Search ........................ 340/657, 660,
340/556, 514, 515; 324/556, 133, 72.5,
771; 364/186, 483; 307/64, 87; 371/22.1,
22.5, 22.6; 395/182.2, 184.01

[56] References Cited

U.S. PATENT DOCUMENTS

| | | | |
|---|---|---|---|
| 4,016,408 | 4/1977 | Koetzle | 235/153 |
| 4,037,156 | 7/1977 | Goujon et al. | 324/158 |
| 4,357,574 | 11/1982 | Takamisawa et al. | 324/73 |
| 5,525,913 | 6/1996 | Brooks et al. | 324/771 |

*Primary Examiner*—Reba I. Elmore
*Assistant Examiner*—Steven R. Garland
*Attorney, Agent, or Firm*—Haynes and Boone, L.L.P.

[57] ABSTRACT

A power supply includes circuitry implementing a self-testing method in which the power supply is first disconnected from its source and the system which it supplies. The power supply testing method then applies an external power source to the supply, insures that the power supply planar is disconnected from the application system and applies a simulated full load to the power supply output. The power supply output voltages are then tested for compliance with predetermined specifications and a test result signal is given to the user. The power supply is then shut off and available for re-connection to the application system.

4 Claims, 6 Drawing Sheets

METHOD AND APPARATUS FOR POWER SUPPLY TESTING

FIELD OF THE INVENTION

The present invention relates generally to power supply systems and more particularly to a self-testing method and apparatus for power supplies.

BACKGROUND OF THE INVENTION

With the proliferation of electronic devices and electronic integrated circuits or chips to operate the devices, there is an increasing need for more complex power supplies to perform compatibly with the integrated circuits. Various kinds of memories, central processing units or CPUs, and other integrated circuits have expanding requirements for power, including an increasing number of required voltages, heat dissipation, space limitations and load specifications. Accordingly, power supply circuits that meet these demands are becoming more costly to manufacture.

Moreover, when there is a power supply failure in the field or while a driven electronic device is "on-line" and in operation within a system, it is frequently an urgent matter to get the power supply fixed and get the system back "on-line". In most computer applications for example, down-time is extremely expensive to a business proprietor and, in many applications, down-time cannot be tolerated beyond a minimal period of time.

Further, when a power supply failure is suspected to be the cause of a system failure, there is presently no acceptable way to troubleshoot the power supply in the field. Generally, the fastest way to get the system back on-line is to replace the entire power supply sub assembly on site. That method is also unnecessarily expensive and creates an inventory of possibly faulty power supplies which need to be either transported back to a depot for troubleshooting and repair, or alternatively, disposed of without even attempting to repair the power supply. The number of "no fault found" (NFF) power supplies as field returns is very great.

Also, there is no present method to test the system power supplies in the field under load conditions. In order to accurately troubleshoot a power supply, the unit must be tested under load conditions in order to determine and ascertain that the fault is within the power supply rather than in the system itself and also to insure that the power supply provides the required voltages and meets other operating specifications under load. Otherwise, a system may be tested for output voltages and check out fine but fail when reinstalled into a system and placed under load.

In addition, current power supplies are not designed to specifically accommodate testing in the field and therefore special testing equipment and tooling need to be transported to the site of the application for use in testing the power supply of a failed system. That process also adds cost in equipment, training and transportation in troubleshooting system power supplies.

Accordingly, there is a need to provide an improved power supply testing method and apparatus which is self-contained within the power supply itself and which is designed to allow quick, efficient and reliable testing of the power supply in the field, and under load conditions without requiring additional field testing equipment.

SUMMARY OF THE INVENTION

It is therefore an object of the present invention to provide a method for testing a power supply apparatus, the power supply apparatus being arranged to apply at least one supply voltage at output terminals thereof to electronic application circuitry, wherein the method includes the steps of disconnecting the power supply apparatus from the electronic application circuitry; applying a simulated load to the output terminals of the power supply apparatus; determining the status of one supply voltage during the time the simulated load is applied to the output terminals of the power supply apparatus; and providing a signal representative of the status.

There is also provided a testing apparatus arranged for connection to, or within, a power supply apparatus which has input terminals thereof arranged for connection to an external power source, the power supply apparatus being selectively operable to provide at least one supply voltage at output terminals thereof for application to electronic application circuitry, the testing device comprising a timing signal generating device coupled to the input terminals of the power supply apparatus, the timing signal generating device being responsive to a signal received from the external power source for providing a first timing signal after the occurrence of a predetermined condition following a connection of the power supply apparatus to the external power source; a simulated load current generating means coupled to the timing signal generating device, the simulated load current generating means being responsive to the first timing signal for applying a simulated load current across the output terminals of the power supply apparatus and providing an indicium signal, said indicium signal being representative of a relationship between the one supply voltage across the output terminals of the power supply apparatus during an application of the simulated load current, and a predetermined output voltage specification.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION

Although the present invention will be explained in connection with the preferred embodiment as applicable to a computer system, it will be understood that the principles of the present invention are equally applicable to any electronic device which includes a power supply or where the testing of key voltages under load conditions is desirable.

Although the present example is explained using an analog example, it will be evident to those skilled in the art that the present invention may also very easily be implemented in with digital circuitry. Moreover, the present invention may also be easily implemented in a portion of single integrated circuit chip package or be reduced to a single stand-alone chip for use within or coupled to any applicable electronic device.

In all of the Figures, like numerals refer to like parts although not all of the like parts may be numbered in all of the drawings in order to more clearly show featured portions of the exemplary embodiment of the present invention as disclosed herein.

Figure 1:
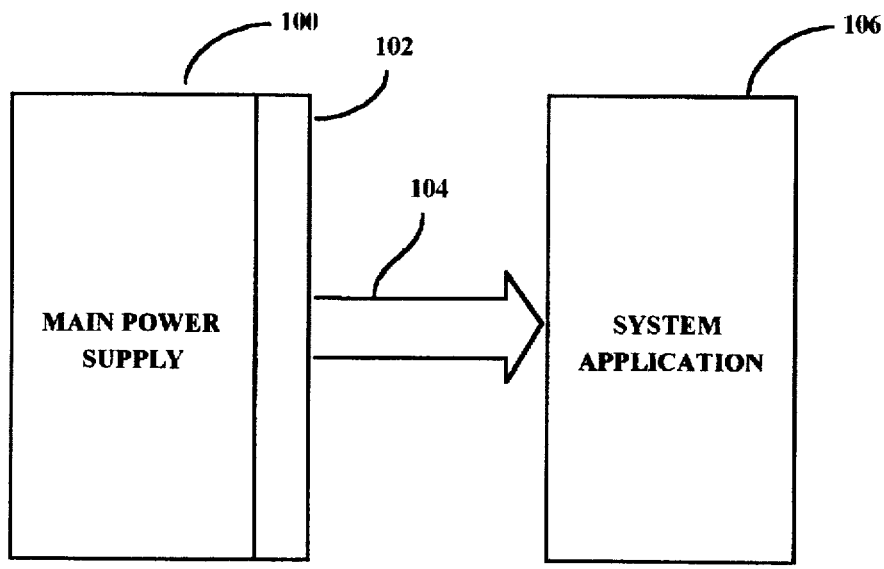
FIG. 1 is a block diagram of a power supply application.

Referring now to FIG. 1 in detail, there is shown a main power supply 100 including a planar connection 102 for supplying specified voltages and signals through connector circuitry 104 to a system application 106. As hereinbefore noted, the system application of the present example is a personal computer (PC) system which is connected to an AC power source through the main power supply 100. The power supply in turn provides various output voltages at specific load conditions, on a planar connector 102 which is selectively connected to the PC system 106. For example, one standard for PCs requires that voltages of +12, +5, −5 −12 and a reference potential be furnished at the planar 102 for application to a PC system.

Also, most power supply systems in use today generate a set of common signals representative of various states within the power supply. Such signals include a "VFP" signal which is a voltage which is always available when the power supply is connected to its power source which is an AC power source in the present example. Another signal which is present in existing power supplies is a Power Off "POFF" signal which, when the signal is at a logic one level, indicates that the power supply is off and not connected to the operating system application. Alternatively, when the POFF signal is at a logic zero level, or if an inverted POFF signal is at a logic one level, the condition that the power supply is connected to the system is represented.

Figure 2:
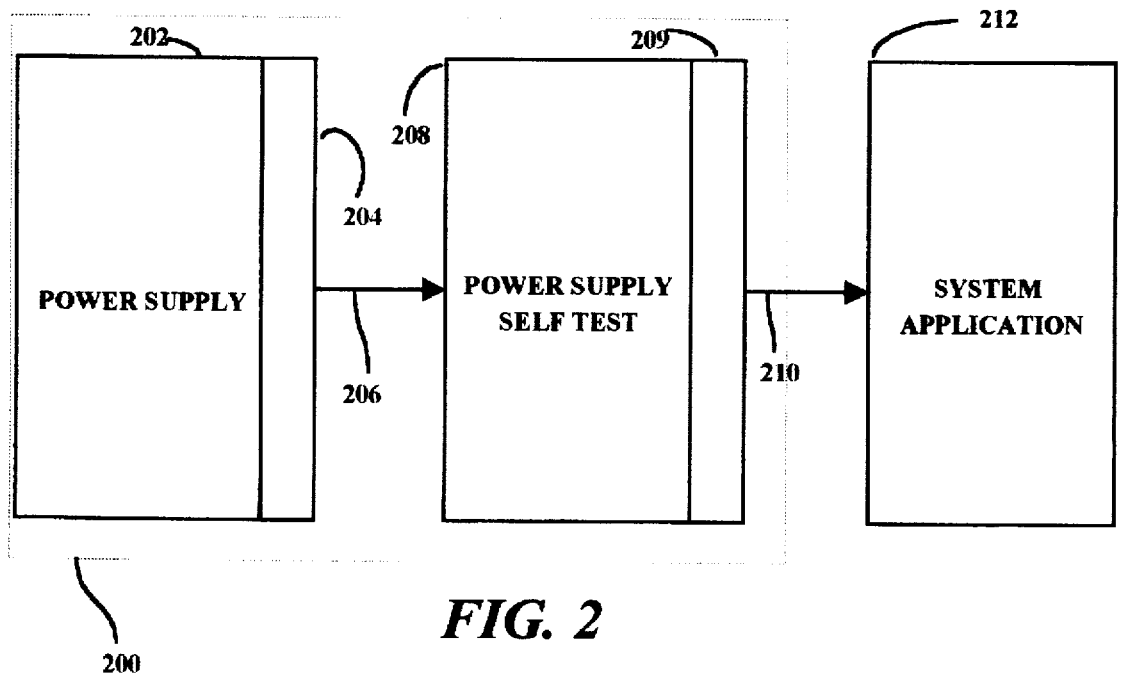
FIG. 2 is another block diagram showing an implementation of the present invention within the system shown in FIG. 1.

In FIG. 2, the power supply self-test circuitry 208 is shown connected to a power supply 202 through a planar interface 204 via a connector 206. The power supply self-test circuitry 208 of the present invention is connected in parallel via a connector 210 a system application 212 and may be included as part of a larger power supply system 200 feeding the system application 212 through another planar connection 209 or it may be implemented in a system as a stand alone circuit or chip.

Figure 3:
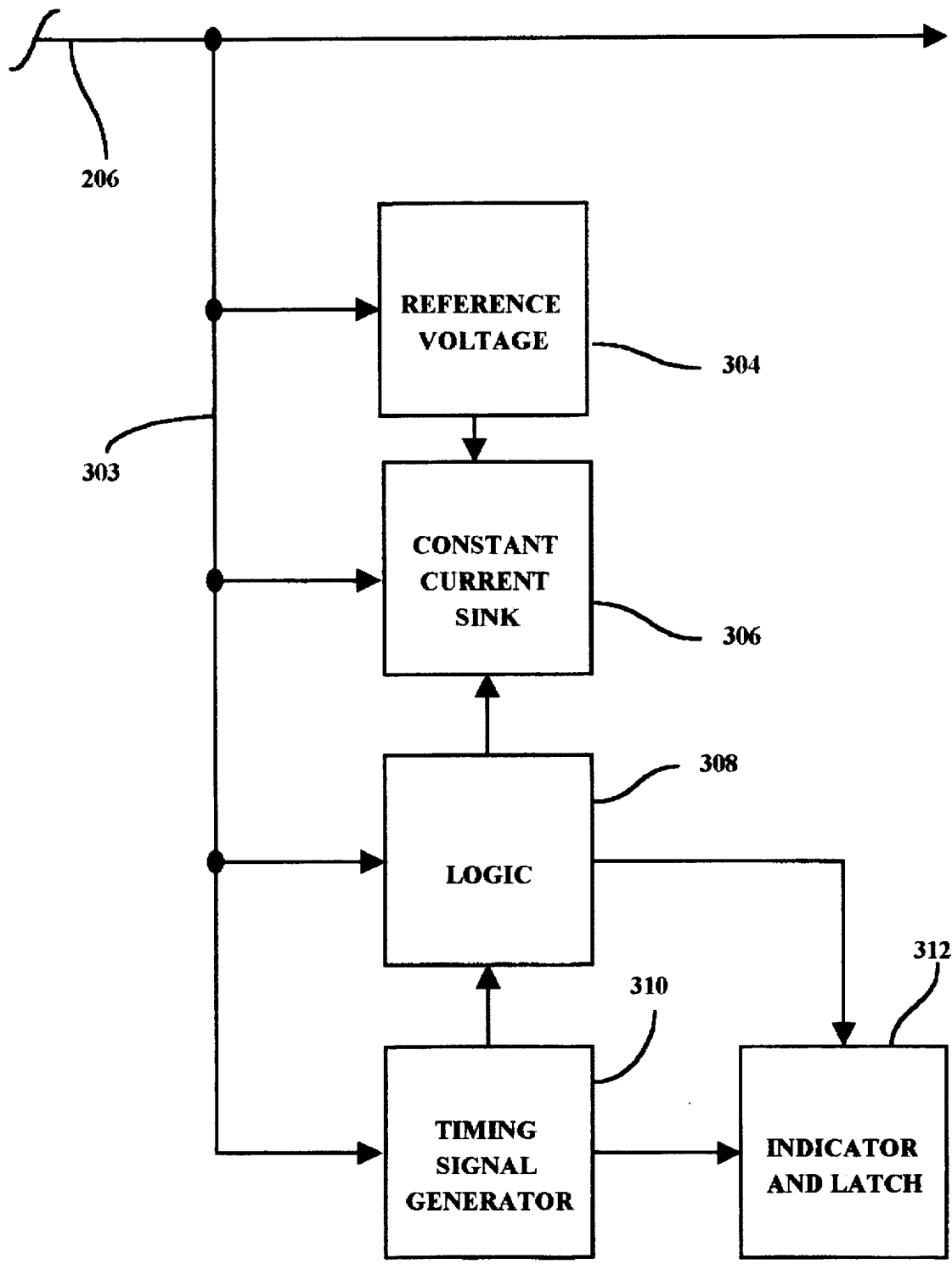
FIG. 3 is a block diagram illustrating the operational blocks with one exemplary embodiment of the present invention.

In FIG. 3, the operational blocks or circuits within the power supply self-test circuit 208 are illustrated. The connection 206 from the power supply 204 in FIG. 2 is shown applied to a bus arrangement 303 for furnishing various existing power supply signals to the self-test circuitry. The self-test circuit 208 is disconnected and then re-connected to the application system 212, in accordance with the operation of the present invention as is hereinafter explained. That function may be implemented electronically or mechanically at the appropriate time in order to accomplish the method of the present invention. The details of any particular implementation (including simply manually connecting and disconnecting a planar connection between the power supply and the application system) are not shown herein since such a function is considered to be easily implemented by those skilled in the art, and also, so as not to obfuscate the broader concepts embodied in the present invention.

The power supply bus 303 is connected to a reference voltage circuit 304 and also to a constant current sink circuit 306. The constant current sink circuit also receives an input from the reference voltage circuit 304. The power supply bus 303 is also connected to a logic circuit 308 and a timing signal generator circuit 310. The timing signal generator circuit 310 is also connected to the logic circuit 308 which, in turn, is connected to the constant current sink circuit 306. An indicator and latch circuit 312 receives inputs from the logic circuit 308 and also from the timing signal generator circuit 310.

Figure 5:
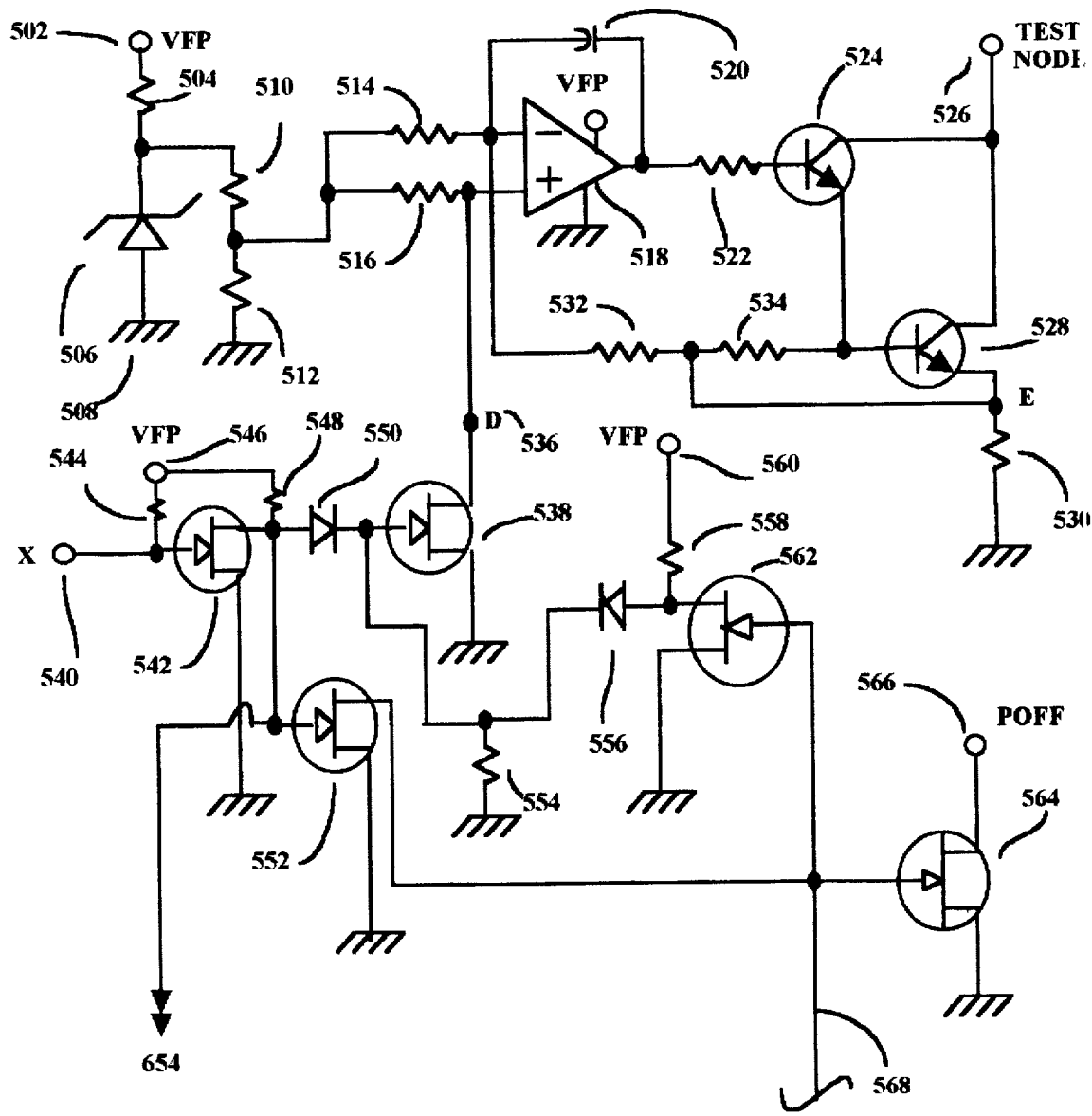
FIG. 5 is a schematic diagram showing a portion of the power supply testing circuitry of one embodiment of the present invention.

FIG. 5 shows the details of the reference voltage circuit 304, constant current sink circuit 306 and logic circuit 308 of one exemplary embodiment of the present invention. The VFP voltage is applied to a terminal 502 which is, in turn, connected through a resistor 504 to the cathode terminal of a Zenor diode 506. The anode terminal of the Zenor diode 506 is connected to a ground reference potential which is also available from the bus 303. The cathode terminal of the Zenor diode 506 is also connected through resistors 510 and 512 to ground. The point between resistors 510 and 512 provides a reference voltage which is applied through a resistor 514 to the negative input of an operational amplifier 518. The reference voltage is also applied through another resistor 516 to the positive input of amplifier 518. The amplifier 518 includes connections to the VFP potential and also to ground. A capacitor 520 connects the negative input of amplifier 518 to its output terminal. The output terminal of the amplifier 518 is also connected through a resistor 522 to the gate terminal of a transistor 524. The resistor 524 has its collector terminal connected to a TEST NODE 526.

The terminal 526 is connected to the collector terminal of a transistor 528, the emitter terminal of which provides a reference signal "E" and is connected through a resistor 530 to ground. The gate terminal of the transistor 528 is connected to the emitter terminal of the transistor 524 and also through a resistor 534 to its emitter terminal at node E. Node E is also connected through a resistor 532 to the negative terminal of the amplifier 518.

The positive input terminal to the amplifier 518 is connected through node D 536 to a drain terminal of a field effect transistor (FET) 538, the source terminal of which is connected to system ground. Pin X540 is applied to the gate terminal of an FET 542. Pin X540 is connected to the planar and is grounded whenever the planar connector, and hence the power supply, is connected to the system. The VFP potential is also applied to a point 546 which is connected to the gate terminal of the FET 542 through a resistor 544. Point 546 is also connected to the drain terminal of the FET 542 through a resistor 548, and the source terminal of the FET 542 is connected to ground. The FET 542 drain terminal is also connected to the anode of a diode 550, the cathode terminal of which is connected to the gate terminal of the FET 538.

The cathode terminal of the diode 550 is connected through a resistor 554 to ground and also to the cathode terminal of another diode 556. The anode terminal of the diode 556 is connected through a resistor 558 to a VFP terminal 560 and also to the drain terminal of an FET 562. The source terminal of the FET 562 is connected to ground. The gate terminal of the FET 562 is connected to the gate terminal of another FET 564 and also to the drain terminal of FET 552. The source terminal of FET 552 is connected to ground and its gate terminal is connected to the anode of diode 550. The drain terminal of FET 564 is connected to point 566 which is connected to the POFF signal line of the power supply circuitry. The source terminal of the FET 564 is connected to ground. The gate terminals of FETs 562 and 564 receive input signals through line 568 from the timing signal generator circuitry shown in FIG. 6.

Figure 6:
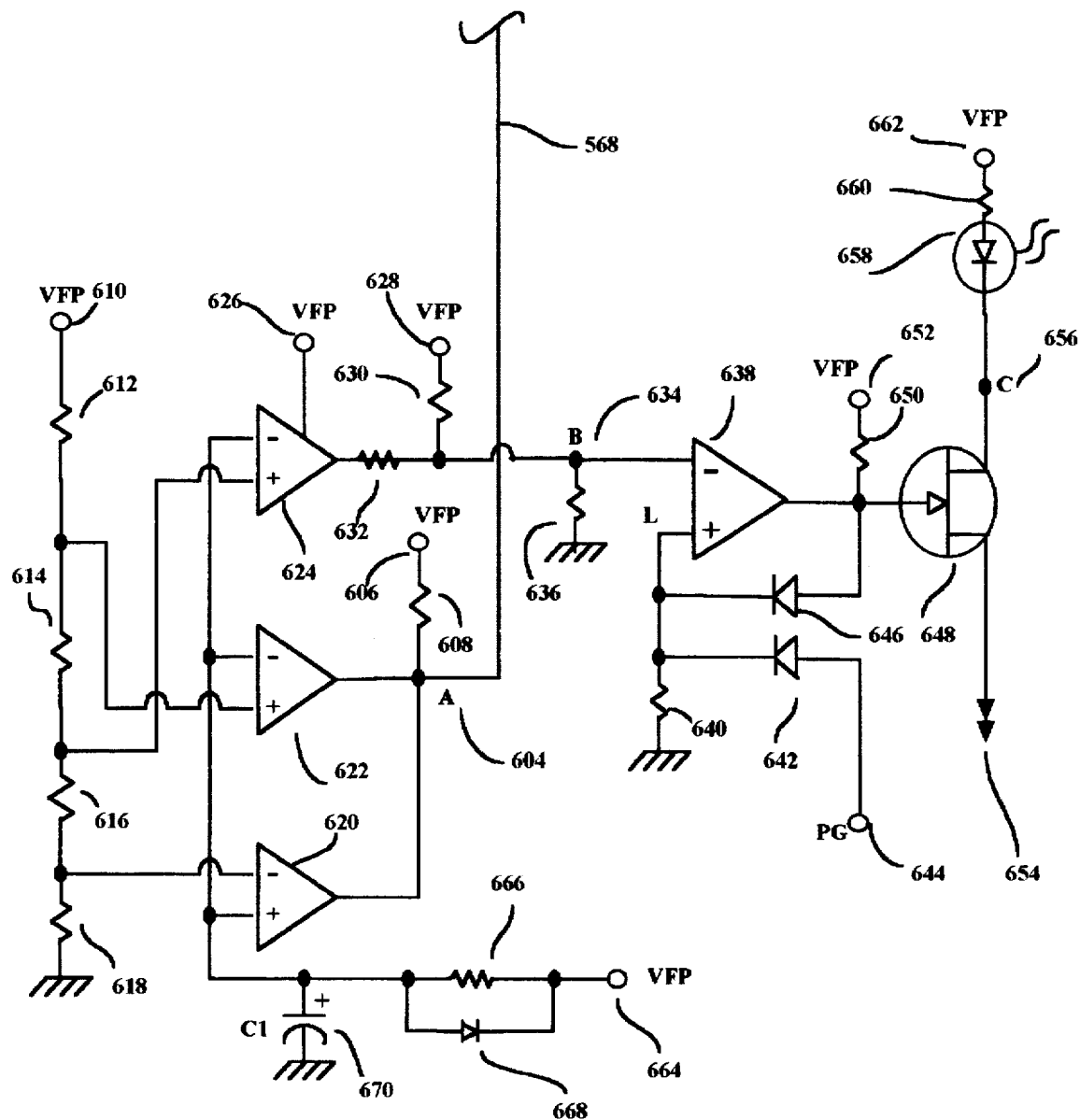
FIG. 6 is another schematic diagram showing another portion of the power supply testing circuitry of the disclosed embodiment of the present invention.

FIG. 6 shows the timing signal generator circuitry 310 and also the indicator and latch circuitry 312 of the power supply self-test circuitry 208. The VFP potential is connected to point 610 which is also connected through a series of four resistors 612, 614, 616 and 618 to ground. The points between the resistors 612, 614, 616 and 618 provide reference potentials which are applied to comparators 620, 622 and 624 to furnish various timing signals for use in timing the various functions accomplished by the exemplary embodiment of the present invention. The common point between resistors 612 and 614 is applied to the positive input terminal of comparator 622. Similarly, the point between resistors 614 and 616 is connected to the positive input terminal of comparator 624 and the point between resistors 616 and 618 is applied to the negative input of the comparator 620.

The VFP potential is applied at point 664 and is connected through a resistor 666 to the positive side of a capacitor 670. The negative side of capacitor 670 is connected to ground. Point 664 is also connected to the cathode of diode 668, the anode of which is connected to the positive side of the capacitor 670. The positive side of capacitor 670 also provides inputs to the positive input of comparator 620 and also to the negative inputs to the comparators 622 and 624. The outputs of comparators 620 and 622 are connected together and to node A at point 604. Node A also provides timing signals to the logic circuitry shown in FIG. 5 through connection 568. Node A is also connected through a resistor 608 to the VFP potential at point 606. The VFP potential is also applied to terminal 626 connected to comparator 624, the output of which is connected through a resistor 632 to a node B 634. Node B is connected through resistor 630 to the VFP potential at point 628 and also through a resistor 636 to ground.

Node B is applied to the negative input of a comparator 638, the output of which is connected to the gate terminal of an FET 648. The source terminal of the FET 648 is connected by line 654 to the anode terminal of diode 550. The drain terminal of the FET 648 is connected to node C 656 which is in turn connected to the cathode terminal of a Light Emitting Diode LED 658. The anode terminal of LED 658 is connected through a resistor 660 to the VFP potential at point 662. The output terminal of the comparator 638 is also connected through a resistor 650 to the VFP voltage at point 652 and also to the anode terminal of a diode 646. The cathode terminal of the diode 646 is connected to the positive input of the comparator 638 and also through a resistor 640 to ground. The positive input to the comparator 638 is also connected to the cathode terminal of another diode 642, the anode terminal of which is connected to the Power Good output line signal PG 644 from the power supply.

Figure 4:
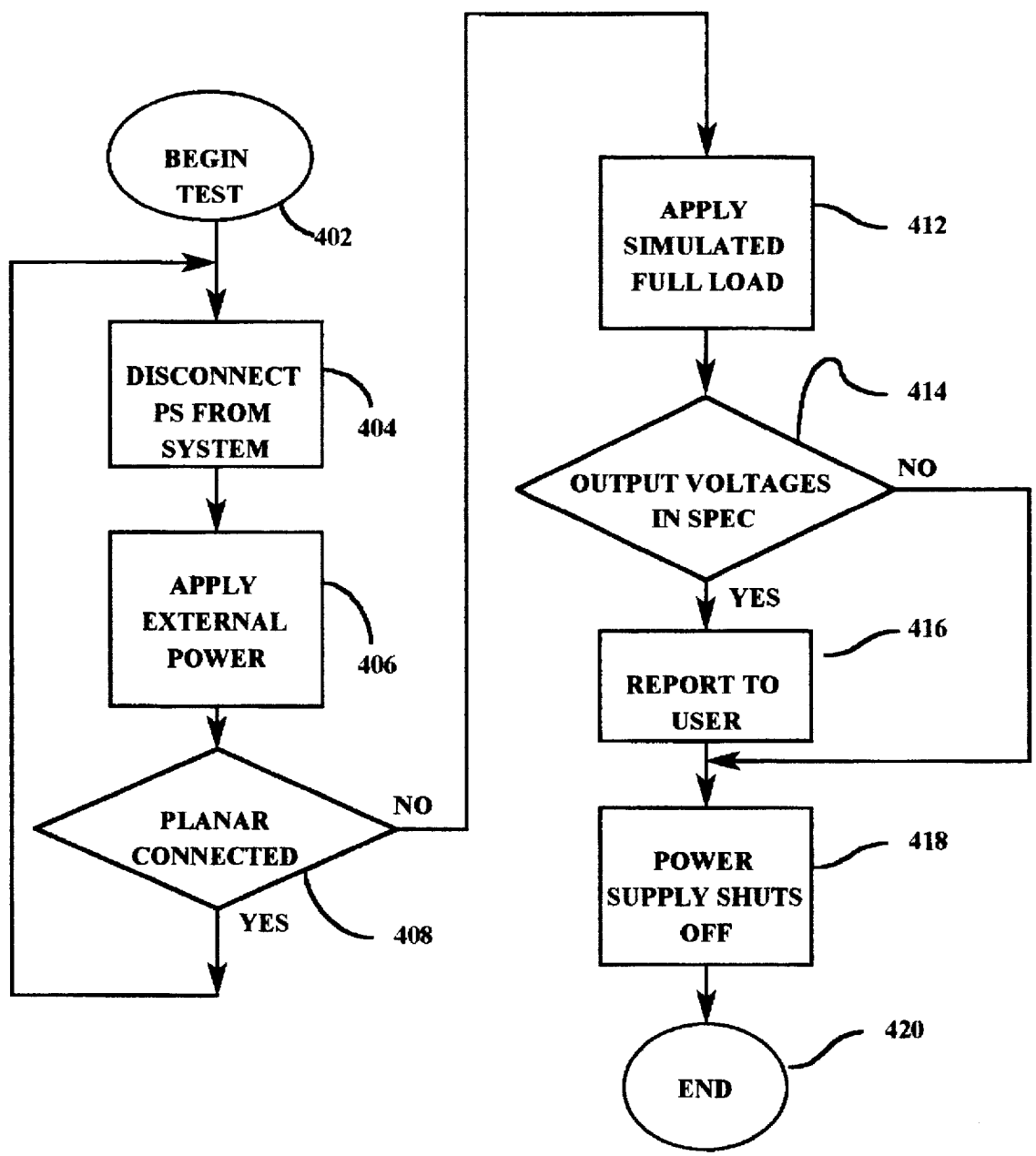
FIG. 4 is a flow chart showing the operational flow of one embodiment of the present invention.
Figure 7:
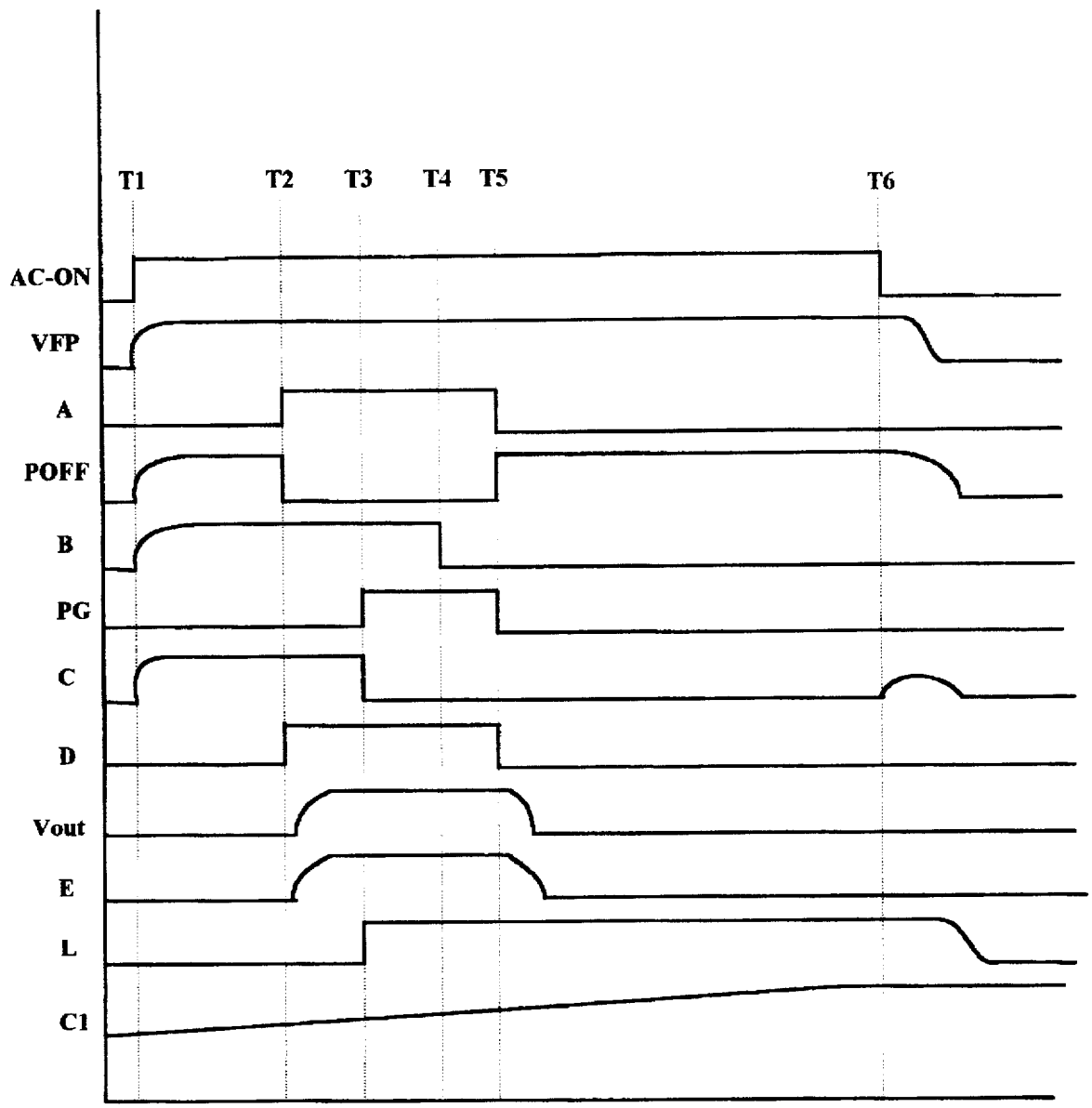
FIG. 7 is a signal timing chart illustrating the relationships between the various signals generated within the disclosed exemplary embodiment of the present invention.

In operation, the functioning of the circuitry shown in FIGS. 5 and 6 can be better understood with reference to the flow chart of FIG. 4 and the timing signal chart of FIG. 7. In general, the method of the present invention teaches that the planar connection to the system be disconnected, and then the power source is connected and the connection of the planar to the system is sensed and confirmed to be unconnected POFF 564. At that time, the power supply is turned on and a controlled full load or loads are applied to the output voltages of the power supply. If all of the output voltages are within specification while under the applied loads, a report is given to the user, for example by the lighting of an LED, and the power supply is turned off. The indication that the power supply is good, e.g. the lighting of the LED, may be arranged to go on and remain on until manually acknowledged and turned off, or the LED may remain on for a predetermined time and then turn off automatically. Thus, a power supply is disconnected from its AC or other source, and then the planar is disconnected from the PC system. Following that procedure, the power supply self testing method and apparatus is again connected to its AC source for example, and, after the method is accomplished by the exemplary circuitry shown herein, and if all of the output voltages are within specification under predetermined applied loads, an indication is given to the user confirming that state. At that point, the power supply is confirmed to be good and if the system remains at fault, causes other than the power supply may be investigated without the unnecessary replacement of a good power supply and without any additional special testing equipment.

More specifically, as shown in FIG. 4, when the test is begun 402 the power source PS is disconnected from the system 404 and external power is applied to the power supply 406. The planar is then checked to determine if it is connected to the system 408. If it is determined that the planar is still connected to the system, the user will insure that the planar is disconnected. After confirmation of planar disconnection, a simulated full load is applied 412 to the power supply and the voltages are checked 414 to determine if they are in compliance with the specification. If the voltages are not within tolerance, the system commands power supply shut-off 418 and ends the test 420. If a determination is made that the power supply voltages are within specified tolerance levels, a report is made to the user 416, and then the power supply shuts off 418 and the test is completed 420. It should be noted that the present example could also be designed to provide an indication to the user if one or more of the voltages under load are out of tolerance rather than within tolerance, without departing from the broad concept of notification to the user of the results of the power supply self testing procedure.

With reference to FIG. 5 and FIG. 6, it is noted that VFP is a five volt signal in the present example and is always present when the power supply is connected to its power source. The charging of the C1 capacitor 670 when the power supply is connected to its power source. Comparators 620, 622 and 624 provide sequential timing signals relative to a point in time when the power supply is connected to a power source, as determined by the charging of the capacitor C1 670. The generation of the timing signals could also be accomplished with digital circuitry including pulse counters, as is well known in the art. In the present example, when AC power is turned ON at time T1 shown in FIG. 7, the VFP voltage will rapidly rise to a 5 volt level. The Power Supply Off signal POFF will also rise to a logic "1" or "true" level which in the present example is 5 volts. The voltage level at nodes B and C also follow to a "1" level.

At time T2, when the charge of C1 670 reaches about one-third of VFP, the voltage at the positive terminal of comparator 620 exceeds the potential between resistors 616 and 618, and node A at the output of comparator 620 goes to a high logic level. At that time, FET 564 conducts and POFF signal goes low thereby commanding the power supply to start up. At the same time, the potential at node D goes high causing amplifier 518 to turn on which, in turn, turns on transistors 524 and 528. Thus the TEST NODE 526 is arranged to simulate the application of a load current at the output of the power supply by which the power supply output voltages at the planar connector can be tested under a full load operating condition. It should be noted that the test load current will not be applied to the power supply unless the planar is first disconnected from the system because the amplifier 518 will not turn the load current sink on until node D goes high which occurs when FET 538 is turned off as a result of node X being at a ground level turning off FET 542 and node A being at a high level turning FET 562 ON which, in turn, will hold FET 538 OFF.

If all of the voltages at the planar connector from the power supply are within a predetermined tolerance level, i.e. within specification. Assuming all of the tested voltage levels have tested "Good", at time T3, the power good PG signal from the power supply goes high which, in turn, causes comparator 638 to switch and effect the closure and latching of the FET 648. With node C going low, LED 658 is forward biased and conducts providing an indication to the user that the power supply has tested "good" under load.

At time T4, comparator 624 switches as capacitor C1 charges to a level exceeding the voltage at the point between resistors 614 and 616. At that time the potential at node B goes low which then allows amplifier 638 to provide a latch function. Shortly thereafter, at time T5, capacitor C1 is charged to a level which exceeds the potential between resistors 612 and 614 and comparator 622 switches and node A is forced to a low level. When A goes low, FET 564 is turned OFF and signal POFF goes high commanding the power supply to shut down. At that time LED 658 will remain latched ON as long as the AC power source remains connected or until the power supply planar is re-connected to the system and pin X is grounded.

The method and apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A testing device arranged for connection between a power supply apparatus and electronic application circuitry, said power supply apparatus having input terminals thereof arranged for connection to an external power source, said power supply apparatus being selectively operable to provide at least one supply voltage at output terminals thereof for application to the electronic application circuitry, said testing device comprising:

a timing signal generating device coupled to the input terminals of the power supply apparatus, said timing signal generating device being responsive to a signal received from the external power source for providing a first timing signal after attainment of a first predetermined voltage level at a selected node within said power supply apparatus following a connection of said power supply apparatus to the external power source;

simulated load current generating means coupled to said timing signal generating device, said simulated load current generating means being responsive to said first timing signal for applying a simulated load current across the output terminals of the power supply apparatus and providing an indicium signal, said indicium signal being representative of a relationship between said one supply voltage across the output terminals of the power supply apparatus during an application of said simulated load current, and a predetermined output voltage specification.

2. A testing device arranged for connection between a power supply apparatus and electronic application circuitry, said power supply apparatus having input terminals thereof arranged for connection to an external power source, said power supply apparatus being selectively operable to provide a plurality of supply voltages at output terminals thereof for application to the electronic application circuitry, said testing device comprising:

a timing signal generating device coupled to the input terminals of the power supply apparatus, said timing signal generating device being responsive to a signal received from the external power source for providing a first timing signal after attainment of a first predetermined voltage level at a selected node within said power supply apparatus following a connection of said power supply apparatus to the external power source;

simulated load current generating means coupled to said timing signal generating device, said simulated load current generating means being responsive to said first timing signal for applying a simulated load current across the output terminals of the power supply apparatus and providing an indicium signal, said indicium signal being representative of relationships between said plurality of supply voltages and a plurality of corresponding output voltage specifications.

3. A power supply apparatus including a testing device, said power supply apparatus having input terminals thereof arranged for connection to an external power source, said power supply apparatus being selectively operable to provide at least one supply voltage at output terminals thereof for application to electronic application circuitry, said testing device comprising:

a timing signal generating device coupled to the input terminals of the power supply apparatus, said timing signal generating device being responsive to a signal received from the external power source for providing a first timing signal after attainment of a first predetermined voltage level at a selected node within said power supply apparatus following a connection of said power supply apparatus to the external power source;

simulated load current generating means coupled to said timing signal generating device, said simulated load current generating means being responsive to said first timing signal for applying a simulated load current across the output terminals of the power supply apparatus and providing an indicium signal, said indicium signal being representative of a relationship between said one supply voltage across the output terminals of the power supply apparatus during an application of said simulated load current, and a predetermined output voltage specification.

4. A power supply apparatus including a testing device, said power supply apparatus having input terminals thereof arranged for connection to an external power source, said power supply apparatus being selectively operable to provide at least one supply voltage at output terminals thereof for application to electronic application circuitry, said testing device comprising:

a timing signal generating device coupled to the input terminals of the power supply apparatus, said timing signal generating device being responsive to a signal received from the external power source for providing a first timing signal after attainment of a first predetermined voltage level at a selected node within said power supply apparatus following a connection of said power supply apparatus to the external power source;

simulated load current generating means coupled to said timing signal generating device, said simulated load current generating means being responsive to said first timing signal for applying a simulated load current across the output terminals of the power supply apparatus and providing an indicium signal, said indicium signal being representative of the relationships between said plurality of supply voltages and a plurality of corresponding output voltage specifications.

* * * * *

UNITED STATES PATENT AND TRADEMARK OFFICE
CERTIFICATE OF CORRECTION

PATENT NO. : 5,710,701
DATED : January 20, 1998
INVENTOR(s) : Alan E. Brown

It is certified that error appears in the above-identified patent and that said Letters Patent is hereby corrected as shown below:

On the Title page, change "Assignee: Deli USA, L.P., Austin, Texas" to --Assignee: Dell USA, L.P., Austin, Texas--

Signed and Sealed this

Fourteenth Day of April, 1998

Attest:

BRUCE LEHMAN

*Attesting Officer*  *Commissioner of Patents and Trademarks*